United States Patent [19]

Harder et al.

[11] Patent Number: 4,711,858

[45] Date of Patent: Dec. 8, 1987

[54] METHOD OF FABRICATING A SELF-ALIGNED METAL-SEMICONDUCTOR FET HAVING AN INSULATOR SPACER

[75] Inventors: Christoph S. Harder, Zurich; Heinz Jaeckel, Kilchberg; Hans P. Wolf, Zurich, all of Switzerland

[73] Assignee: International Business Machines Corporation, Armonk, N.Y.

[21] Appl. No.: 875,835

[22] Filed: Jun. 18, 1986

[30] Foreign Application Priority Data

Jul. 12, 1985 [EP] European Pat. Off. ........ 85108694.2

[51] Int. Cl.$^4$ .......................................... H01L 21/302
[52] U.S. Cl. ...................... 437/99; 437/234; 437/176; 156/656; 357/23.2
[58] Field of Search ............. 29/571, 576 E; 148/171, 148/175; 357/15, 22 I, 22 K, 23.2; 437/99, 234; 156/656

[56] References Cited

U.S. PATENT DOCUMENTS

| | | | |
|---|---|---|---|
| 3,928,092 | 12/1975 | Ballamy et al. | 148/175 |
| 4,111,725 | 9/1978 | Cho et al. | 148/175 |
| 4,265,934 | 5/1981 | Ladd, Jr. | 427/84 |
| 4,325,181 | 4/1982 | Yoder | 29/571 |
| 4,396,437 | 8/1983 | Kwok et al. | 148/1.5 |
| 4,404,732 | 9/1983 | Andrade | 29/571 |
| 4,426,767 | 1/1984 | Swanson et al. | 29/571 |
| 4,545,109 | 10/1985 | Reichert | 29/571 |

OTHER PUBLICATIONS

Thorne et al., Japan, J. App'l Phys. 21, pp. 1223-1224 (Apr. 1982).
N. Yokoyama et al in IEEE Trans. Electron, Devices, Ed-29, 1541 (1982).
N. Yokoyama et al in IEEE T. Solid State Circuits, SC-18, 520 (1983).
Y. Yamasaki et al in IEEE Electron. Devices, Ed-29, 1772 (1982).
N. Kato et al in IEEE Electron. Devices, Ed-30, 633 (1983).
R. S. Pengally's "Microwave Field-Effect Transistors—Theory, Design and Applications", (Research Studies Press, 1982), Chap. 4, pp. 129ff).
"A WSI/TiN/Au Gate Self-Aligned GaAs MESFET with Selectively Grown n+ Layer Using MOCVD", by K. Imamura et al in Japan Journal of Applied Physics, vol. 23, No. 5, May 1984, pp. L342-345.
"GaA/As/GaAs Integrated Optoelectronic Transmitter Using Selective MOCVD Epitaxy and Planar Ion Implantation", by M. E. Kim et al in GaAs I.C. Symposium, 1983, IEEE, pp. 44-47 (1983).

*Primary Examiner*—Olik Chaudhuri
*Attorney, Agent, or Firm*—Stephen J. Limanek

[57] ABSTRACT

A method for the fabrication of self-aligned MESFET structures with a recessed refractory submicron gate. After channel formation on a semi-insulating (SI) substrate, which may consist of a III-V compound semiconductor such as GaAs, with subsequent annealing, refractory gate material is deposited and patterned. This is followed by the overgrowth of a highly doped contact layer of, e.g., GaAs, using MOCVD of MBE processes resulting in poly-crystalline material over the gate "mask" and mono-crystalline material on exposed semiconductor surfaces. Next, the poly-crystalline material is removed in a selective etch process, this step being followed by the deposition of source and drain electrodes. In order to further improve process reliability, insulating sidewalls are provided at the vertical edges of the gate to avoid source-gate and drain-gate shorts.

10 Claims, 18 Drawing Figures

METHOD OF FABRICATING A SELF-ALIGNED METAL-SEMICONDUCTOR FET HAVING AN INSULATOR SPACER

DESCRIPTION

1. Technical Field

The invention relates to a method of fabricating a self-aligned metal-semiconductor field effect transistor (MESFET), the transistor being formed on a semiconductor substrate and comprising a current channel and associated source, gate and drain electrodes. The process is particularly suited for technologies using III-V compound semiconductors such as gallium arsenide (GaAs).

2. Background Art

The FET has become an established element not only in microwave technology but also in switching and data processing system applications. Because of their superior device properties, GaAs structures have received increased attention and for high speed integrated circuit applications there is an increasing need for submicron FETs, i.e., transistors with gate lengths of below one micron.

Many different FET structures have been proposed, most aimed at reducing the gate length and the parasitic resistances that substantially determine the maximum operational speed of the devices. Such processes have been described by:

N. Yokoyama et al. in IEEE Trans. Electron Devices, Ed-29, 1541 (1982),

N. Yokoyama et al. in IEEE J. Solid State Circuits, Sc-18, 520 (1983),

Y. Yamasaki et al. in IEEE Electron Devices ED-29, 1772 (1982), and

N. Kato et al. in IEEE Electron Devices ED-30, 663, (1983).

In essence, the proposed structures are of two types: (a) Those having a refractory gate deposited as the first metallization that is then subjected to the post-implant annealing step at 850° C. or more, and (b) those using initially a "dummy" gate, consisting of oxide or photoresist, which is replaced by the final gate metallization in a final process step, and which therefore does not have to withstand the high anneal temperatures. Technologically the first process (a) is simpler but the choices of gate metals is restricted. Process (a) furthermore provides for structures having self-aligned contacts not requiring implantation with its associated problems, and permitting contact geometries that reduce charge injection into the substrate and capacitance coupling to the channel, i.e., the short channel effect.

The process hereinafter described is directed to the fabrication of refractory gate FET devices with the associated advantages but since this novel process does not require an annealing heat treatment after gate deposition, the gate metal does not have to withstand the high annealing temperatures. The highest temperature to which the gate is subjected is that during a subsequent metal-organic chemical vapour deposition (MOCVD) or molecular beam epitaxy (MBE) process which is about 550° to 600° C. This permits the use of a wider range of gate materials.

In the development of reliable and precise fabrication processes for high speed FETs, specific techniques and device structures have been introduced, particularly the self-aligned gate technology as well as recessed channel structures. These techniques are described in, e.g., R.S. Pengelly's book "Microwave Field-Effect Transistors—Theory, Design and Applications" (Research Studies Press, 1982, Chapter 4, pp. 129ff.). The previously disclosed structures have a common drawback in that gate deposition occurs after recess etching, the latter being critical in that the threshold voltage of the device depends heavily on the depth of the recess and in that the etch process is difficult to control with sufficient precision.

The herein proposed process provides for a structure offering the advantage that this sequence is, in essence, reversed in that the gate is deposited first whereas the recess structure is formed only afterwards in subsequent process steps. As a result, the new process permits full-wafer cleaning and gate material deposition and avoids the need for critical precise recess etching steps.

Basically, the inventive process proposed in the present specification takes advantage of the fact that the growth of at least some semiconductor materials such as GaAs and GaAlAs over metal or oxide masks becomes locally poly-crystalline. The process also makes use of the fact that the etch rate of poly-crystalline material is considerably higher than that of mono-crystalline material, i.e., the poly-crystalline regions, grown over metal or oxide masks, can be selectively removed in a simple wet-etching step since the mono-crystalline material grown on semiconductor surfaces will hardly be affected.

The fact that overgrowth over oxide masks is poly-crystalline and that the etch rates for poly- and mono-crystalline semiconductor materials are largely different are known and some limited applications—that differ however substantially from the process of the present invention—have been described in the following publications:

U.S. Pat. No. 4,426,767 entitled "Selective Epitaxial Etch Planar Processing For Gallium Arsenide Semiconductors" notes, in the background section, the formation of poly-crystalline material on masks as an undesirable feature since it may interfere with further processing steps and hinder device performance.

An article entitled "A WSI/TiN/Au Gate Self-Aligned GaAs MESFET with Selectively Grown n+ -Layer using MOCVD" by K. Imamura et al. in Jap. Journal of Appl. Physics, Vol. 23, No. 5, May 84, pp. L 342–345, describes a complex process that avoids the formation of poly-crystalline material by using a layered gate, the top layer consisting of gold.

U.S. Pat. No. 4,111,725 entitled "Selective Lift-Off Technique for Fabricating GaAs FETs" proposes a method for forming source and drain electrodes that comprises the steps of applying a continuous dielectrive layer, opening windows to expose the underlying semiconductor surface, using a MBE process to grow mono- and poly-crystalline material on the semiconductor surface and on the dielectric mask, respectively. Subsequent etching causes the dielectric mask to dissolve and the poly-material to lift-off.

An article entitled "GaAlAs/GaAs Integrated Optoelectronic Transmitter Using Selective MOCVD Epitaxy And Planar Ion Implantation" by M. E. Kim et al. in GaAs IC Symposium 1983 IEEE, pp. 44–47, describes a process for fabricating optical device structures. It involves the use of dielectric masks on which poly-crystalline material is grown and subsequently removed by chemical etching.

None of these references show or suggest the use of a FET metal gate as a mask on which poly-crystalline material is grown when depositing a III-V group compound layer whereby, in a subsequent process step, the poly-crystalline material can be selectively etched in the transistor gate region.

DISCLOSURE OF THE INVENTION

It is an object of the present invention to provide a process for fabricating a self-aligned metal-semiconductor field effect transistor (MESFET) structure with a recessed refractory submicron gate involving less critical process steps than hitherto required. Another object is to devise a MESFET fabrication process that provides for very effective self-alignment between the gate contact and the highly doped source and drain contact regions and for a channel recess structure not requiring precise recess etching steps.

The invention as claimed remedies the drawbacks encountered with hitherto known FET fabrication processes. The main advantages offered by the invention are the simplicity and reliability of the process since a number of critical process steps can be avoided. Also, because the process provides for self-alignment of the most critical structural features, the process permits gate length of well below 1$\mu$ and provides for very low source-gate resistances, thus, permitting the fabrication of high speed integrated circuit technology FETs. Particularly when using insulating sidewalls on the vertical edges of the gate electrode to avoid source-gate and drain-gate shorts, process reliability and reproducibility are further advanced.

Various ways of carrying out the invention are described in detail below with reference to the accompanying drawings.

BEST MODE FOR CARRYING OUT THE INVENTION

Figure 1:
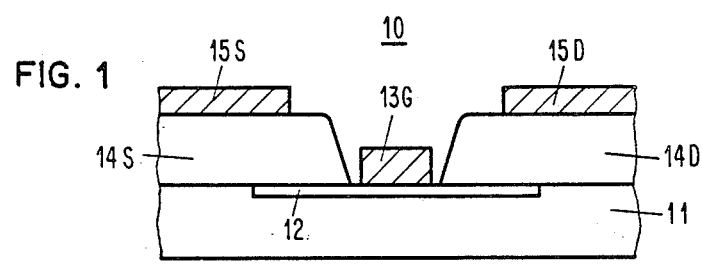
FIG. 1 is a cross-sectional representation of an embodiment of a MESFET produced in a first process in accordance with the invention.

Referring now to the drawings in more detail, and first to FIG. 1 thereof, there is shown a first embodiment of a MESFET produced in accordance with the principles of the present invention. The MESFET 10 is formed on a semi-insulating (SI) GaAs substrate 11. The self-aligned device 10 comprises a relatively shallow n-type channel 12 with a thickness of approximately 50 nm and a dopant concentration in the order of $4 \times 10^{17}$ atoms/cm$^3$. Arranged on the channel 12 is a submicron metal gate 13G consisting of a refractory material such as W$_3$Si. Positioned on either side of the gate electrode 13G but separated therefrom are heavily n$^+$ doped GaAs contact layers 14S and 14D forming source and drain regions, respectively. Regions 14S and 14D are deposited on the surface of the SI substrate 11 partly overlapping the channel region 12 as illustrated in FIG. 1 of the drawings. Their dopant concentration is about $1 \times 10^{18}$ atoms/cm$^3$ but can be higher. Device 10 further includes ohmic source and drain electrodes 15S and 15D, respectively, connecting to the underlying heavily doped GaAs contact layers 14S and 14D.

In FIGS. 2A-2H, the successive steps of the process to fabricate the MESFET of FIG. 1 in accordance with the present invention are illustrated in detail. These successive steps are listed in Table I indicating the correspondence between the steps and the drawings.

TABLE I

| Step No. | Description of Process Step | FIG. |
|---|---|---|
| 1 | Channel 12 definition and implant | 2A |
| 2 | Activation of channel implant | |
| 3 | Deposition of refractory gate layer 13 | 2B |
| 4 | Patterning of gate electrode 13G | 2C |
| 5 | Overgrowth of highly doped contact layer 14 | 2D |
| 6 | Removal of poly-crystalline material 14P formed above gate metal 13G | 2E |
| 7 | Lithography 22 for definition of source and drain electrodes 15S and 15D | 2F |
| 8 | Deposition of source/drain metal layer 15S, 15G and 15D | 2G |
| 9 | Patterning of source/drain electrodes 15S and 15D | 2H |
| 10 | Alloying of source/drain contacts | |

While the following description is primarily directed to the fabrication of the MESFET shown in FIG. 1, this description is exemplary of the fabrication of a class of devices which embody the principles of the present invention. It should be noted that the thickness and other dimensions, and materials used, as well as process parameters shown herein, are selected for clarity of illustration and are not to be interpreted in a limiting sense. Most individual process steps used to evaporate, to etch, to clean, to pattern are well known and can be performed by employing conventional equipment and techniques. They are, therefore, not explained in greater detail below.

Referring now again to FIG. 2A, the fabrication process is initiated starting from a semi-insulating undoped or chromium doped GaAs substrate 11 in which the FET channel 12 of n-type conductivity is formed (Step 1). This step consists of exposing openings in an applied photoresist layer in the area of the substrate where the channel is to be formed and implanting n-type ions such as silicon directly into the exposed substrate. The energy and dose of ions implanted are chosen such that the semiconducting n GaAs layer 12 resulting therefrom is shallow, having a depth of approximately 50 nm and a dopant concentration of a about $4 \times 10^{17}$ atoms/cm$^3$. Typically, the dose used is $2 \times 10^{12}$ atoms/cm$^2$ at 50 keV.

The ion implant step is followed by an annealing heat treatment (Step 2) at about 850° C. serving to activate the channel implant. In order to prevent the As from escaping this is done in a protective gas atmosphere or after covering the wafer surface with a protective cap such as a silicon nitride (Si$_3$N$_4$) layer.

The n-channel 12 may also be formed by other techniques. If an epitaxy process is used, this can consist of growing an initial epitaxial layer of about 30 nm thickness and a dopant concentration of about $4 \times 10^{17}$ atoms/cm$^3$ onto the substrate surface, this being followed by lithographic processes resulting in a mesa forming a n-channel of about the same properties as the channel 12 otherwise obtained by ion implantation.

Figure 2A:
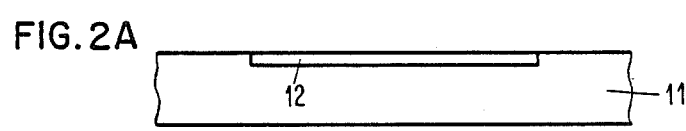
FIGS. 2A-2H are cross-sectional illustrations of the steps of the first process resulting in the structure shown in FIG. 1.
Figure 2B:
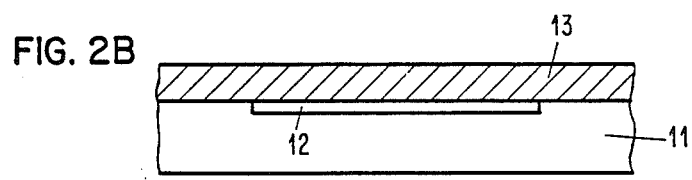
Figure 2C:
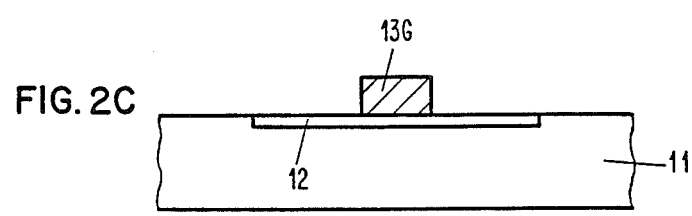

Next, referring to FIG. 2B, layer 13 of a heat resistive refractory metal such as tungsten silicide ($W_3Si$) of about 0.25 $\mu$m thickness is deposited (Step 3) on the wafer surface using any suitable conventional method. Subsequently, as illustrated in FIG. 2C, the MESFET gate 13G is patterned (Step 4) using lithographic techniques to cover the gate region with an etch-resistant mask and to subsequently etch the exposed region of layer 13. An anisotropic etch process such as reactive ion etching (RIE) in $CF_4/O_2$ can advantageously be used for this purpose.

Figure 2D:
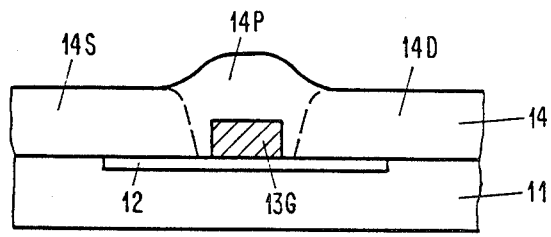

In the succeeding step 5 of the process, which is illustrated in FIG. 2D, a highly doped n+ GaAs contact layer 14 covering the whole structure is grown using MOCVD or MBE processes. Process conditions are chosen such that regions 14S and 14D of this layer, i.e., those that are grown on semiconductor surfaces (substrate 11 and the channel 12) are mono-crystalline whereas region 14P over-lying the metal gate 13G is poly-crystalline. Layer 14 has a thickness of approximately 400 nm, the dopant concentration is typically in the order of $1 \times 10^{18}$ atoms/cm$^3$.

Figure 2E:
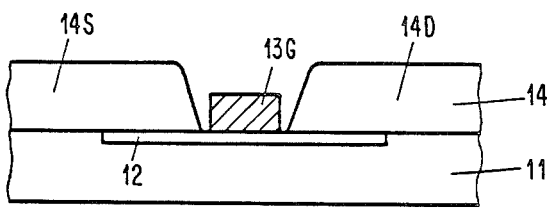

In the following step 6, the result of which is shown in FIG. 2E, the poly-crystalline material of region 14P is removed by employing any selective wet-etch process, e.g., using HCl. The mono-crystalline regions 14S and 14D remain virtually unaffected by this etch process since the etch-rate of poly-GaAs is substantially higher than that of mono-crystalline material.

Figure 2F:
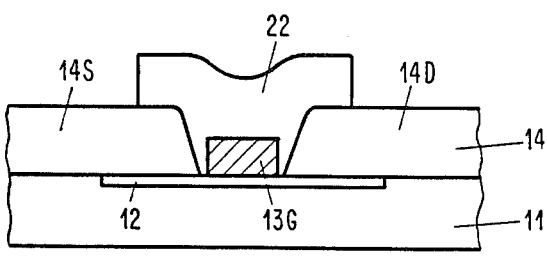
Figure 2G:
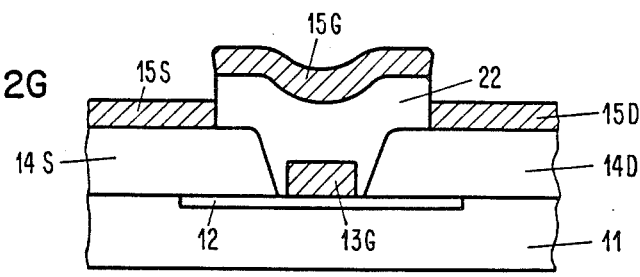
Figure 2H:
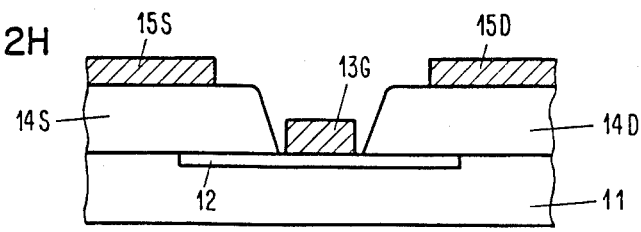

The next three figures, FIGS. 2F, 2G and 2H, illustrate the deposition of the source and gate electrodes 15S and 15D. First (Step 7), a lift-off mask 22 is deposited (FIG. 2F). Thereafter (Step 8), a layer of metal providing for good electrical contact with the underlying contact layers 14S, 14D is applied, this metal layer comprising regions 15S and 15D, deposited over contact layers 14S and 14D, respectively, and region 15G, deposited on mask 22 located on top of the gate 13G. In a subsequent conventional lift-off step 9, mask 22 and section 15G of the metal layer are removed leaving source and drain electrodes 15S and 15D, respectively. The contact layer may consist of Au-Ge-Ni-Au with a thickness of approximately 100 nm. In a final step 10, the contacts are alloyed for 30 seconds at a temperature of 450° C. The resulting structure which is shown in FIG. 2H corresponds to that of FIG. 1.

In integrated circuits a large number of individual MESFET devices are formed on a wafer that need to be separated from each other. For such applications additional process steps are required to provide for device separation. An example is the n+ GaAs layer 14 that, after the above described process step 5 (illustrated in FIG. 2D), covers the whole wafer structure thereby providing for intolerable inter-device connections. This can be avoided by subsequently applying masks covering the n+ GaAs regions 14S, 14P and 14D of the MESFET devices and then etching the uncovered n+ GaAs, thereby providing for device isolation.

Figure 3:
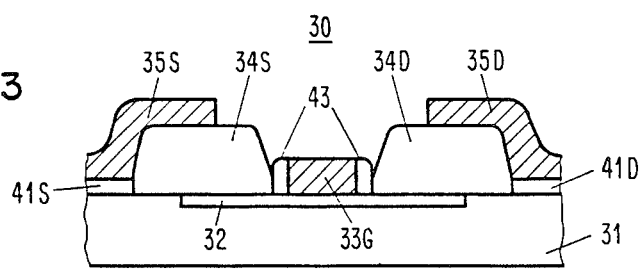
FIG. 3 is a cross-sectional representation of a second embodiment of a MESFET produced in a second process in accordance with the invention.

A second embodiment of a MESFET 30 produced in accordance with the principles of the present invention is shown in FIG. 3. The MESFET 30 is formed on a semi-insulating GaAs substrate 31. The self-aligned device 30 comprises an n-type channel 32 with dimensions and properties similar to those of layer 12 of the MESFET in accordance with FIG. 1. Arranged on the channel 32 is a refractory gate 33G, its vertical edges being covered with sidewall spacers 43 in order to prevent any shorts between the gate 33G and the adjacent heavily n+ doped GaAs contact layers 34S and 34D that form source and drain regions, respectively. The latter regions are deposited on the surface of the SI substrate 31 partly overlapping the channel region 32 as illustrated in FIG. 3 of the drawings. Their dopant concentration is at least $1 \times 10^{18}$ atoms/cm$^3$. Device 30 further includes ohmic source and drain electrodes 35S and 35D, respectively, connecting to the contact layers 34S and 34D but separated from the substrate 31 by dielectric layers 41S and 41D.

In FIGS. 4A–4H the successive steps of the process to fabricate the MESFET of FIG. 3 in accordance with the present invention are described in detail. These successive steps are listed in Table II indicating the correspondence between the steps and the drawings. Since a number of process steps listed in Table II parallel the steps listed in Table I, the following detailed description will be limited to those steps which are significantly different from those already discussed above.

TABLE II

| Step No. | Description of Process Step | FIG. |
|---|---|---|
| 1 | Channel 32 definition and implant | 4A |
| 2 | Activation of channel implant | |
| 3 | Deposition of refractory gate layer 33 | 4B |
| 4 | Patterning of gate electrode 33G | 4C |
| 5 | Deposition of dielectric layer 41 for later contact region patterning | 4D |
| 6 | Lithography 42S and 42D for definition of source and drain contact regions | 4E |
| 7 | Anisotropic etching of exposed dielectric layer forming insulating sidewalls 43 at vertical edges of gate electrode | 4F |
| 8 | Overgrowth of highly doped contact layer 44S, 44P and 44D | 4G |
| 9 | Removal of poly-crystalline material 44P formed above gate metal 33G and above remaining dielectric layers 41S and 41D | 4H |
| 10 | Deposition of source/drain metal layer 35S, 35D in FIG. 3 | as in FIGS. 2F to 2H |
| 11 | Patterning of source/drain electrodes 35S and 35D | |
| 12 | Alloying of source/drain contacts | |

Figure 4A:
FIGS. 4A-4H are illustrations of the steps of the second process resulting in the structure shown in FIG. 3.
Figure 4B:
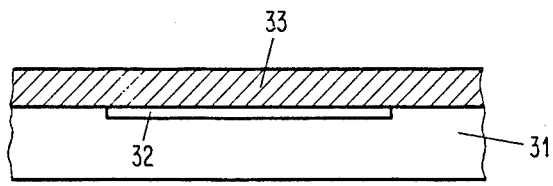
Figure 4C:
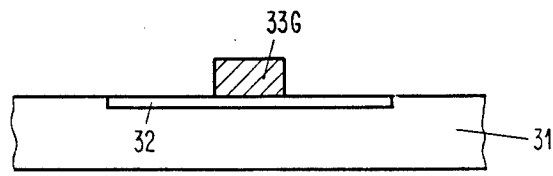

The fabrication process of the MESFET shown in FIG. 3 starts, as illustrated in FIG. 4A, with the definition and implant of the n-channel 32 in the SI GaAs substrate 31 (Step 1) followed by an annealing process to activate the implant (Step 2). As shown in FIGS. 4B and 4C, this is followed by the deposition of an refractory gate layer 33 (Step 3) with subsequent patterning of the gate electrode 33G (Step 4). These process steps are accomplished along the lines of the corresponding steps of Table I which were described previously in connection with FIGS. 2A, 2B and 2C.

Figure 4D:
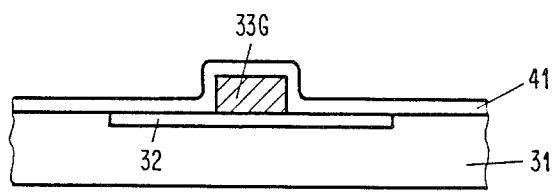
Figure 4E:
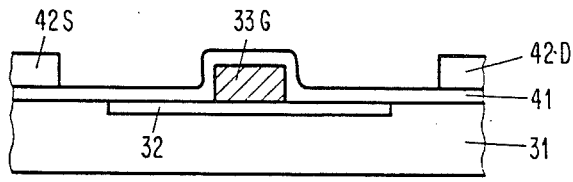
Figure 4F:
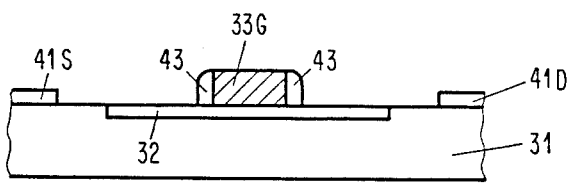

The next process step, illustrated in FIG. 4D, is the deposition of a dielectric layer 41 consisting of, e.g., $Si_3N_4$ in a Plasma Chemical Vapor Deposition (PCVD) process (Step 5). The thickness of the layer 41 is in the range from 50 to 100 nm. FIG. 4E shows the next step in which, using conventional lithographic techniques, an etch mask comprising regions 42S and 42D is applied (Step 6) in preparation for the subsequent anisotropic RIE etching step by which the exposed $Si_3N_4$ of layer 41 is removed (Step 7). After the removal of the mask portions 42S and 42D, the structure shown in FIG. 4F is obtained. Si₃N₄ is still present in regions 41S and 41S where it serves as a mask for contact regions to be formed in a later process step and, in addition, due to the anisotropic etching, at the vertical edges of the gate electrode 33G where it forms insulating sidewalls 43.

Figure 4G:
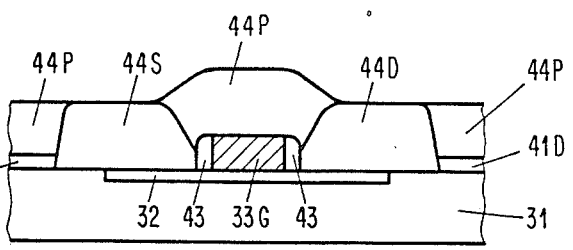

FIG. 4G illustrates step 8, i.e., the overgrowth of an highly doped n+ GaAs contact layer in a process very similar to that described in connection with FIG. 2D and the fabrication of the MESFET in accordance with FIG. 1. However, due to the presence of dielectric layers 41S and 41D, not only the n+ GaAs material grown over the metal gate 33G is poly-crystalline but also the material grown over the dielectric layers 41S and 41D at both sides of the gate 33G is poly-crystalline, i.e., all three regions 44P are poly-crystalline. Regions 44S and 44D, on the other hand, are grown on semiconductor material and are, therefore, mono-crystalline.

Figure 4H:
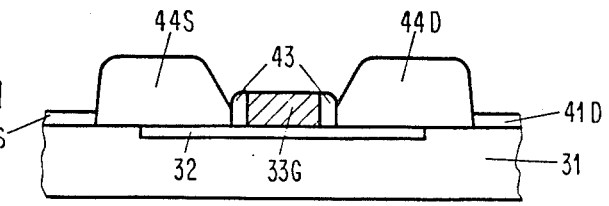

In the succeeding step 9, the result being shown in FIG. 4H, the poly-crystalline material of regions 44P is removed in very much the same way as in the step illustrated in FIG. 2E, i.e., the mono-crystalline regions 44S and 44D remain virtually unaffected by the etch process since the etch-rate of poly-GaAs is substantially higher than that of the mono-crystalline material. It is, however, to be noted that the contact layer sections 44S and 44D are clearly separated from the gate electrode 33G by sidewall spacers 43. They are, furthermore, limited in their "outword" extension by the dielectric layers 41S and 41D, thereby providing for device separation on the SI substrate 31 that forms the integrated circuit wafer on which a large number of devices can be formed.

Not shown in FIGS. 4 are steps 10, 11 and 12 required to deposit and define the source and gate electrodes 35S and 35D, the process being virtually identical to that described with the aid of FIGS. 2F, 2G and 2H for the MESFET structure of FIG. 1. It should, however, be noted that the electrode layer regions 35S and 35D are not entirely deposited on the n+ GaAs layer, as are regions 14S and 14D in FIG. 2G, but are partly covering the dielectric layers 41S and 41D as illustrated in FIG. 3, which shows the resulting MESFET structure 30.

Further alternative processes that are based on the concepts described above have been designed, one example being a process for fabricating a MESFET structure similar to that shown in FIG. 1, or FIG. 3, but in which the heavily doped n+ semiconductor contact layers 14S and 14D, grown on the structure after gate deposition, consist of a semiconductor different from that of the substrate 11 and in which hot electrons injected from the contact layer 14S into the channel 12 are advantageously used to improve device characteristics. For such a MESFET structure, having an epitaxially grown mesa-type n-channel 12, the substrate 11 can consist of SI GaAs whereas GaAlAs is used for the n+ contact layers 14S, 14D, e.g., Ga₀.₇AL₀.₃As. In order to obtain the desired hot electron effect, which requires the hot electrons injected from the GaAAs into the GaAs channel 12 to travel at least a certain distance in the channel underneath the controlling gate before reaching the equilibrium state in the GaAs, the n-channel 12 is, after gate deposition, etched so that the channel 12 is confined to the region fully covered by the gate. The subsequently deposited n+ GaALAs contact layer then contacts the n-channel within the gate region, whereby the hot electrons are injected directly into the gate-controlled channel region.

For specific applications and structures it may also be desirable to use, for both, the substrate and for the n+ contact layer, materials other than those employed in the above described examples. Instead of using GaAs, the basic system material used could be, e.g., InP or Si.

In addition, it can be advantageous to use tapered contact layers by, e.g., starting with n+ InGaAs at a GaAs substrate surface and changing to n+ InAs towards the top of the contact layer to improve the growth on the substrate and, on the other hand, to provide for good contacts with the subsequently deposited electrode material.

From the above it will be evident that many other alternatives, modifications and variations still falling within the scope and spirit of the present invention will be apparent to those skilled in the art.

In summary, the inventive process makes use of the fact that growth of GaAs, or GaALAs or other suitable semiconductors, over metal or oxide "masks" becomes locally poly-crystalline, thereby permitting selective etching of masked regions because the etch-rate of poly-GaAs is substantially higher than that of monocrystalline material. This permits a very simple process suitable for integrated circuit technology fabrication of submicron recessed gate MESFET structures in that gate deposition is done prior to forming the recess structure. Deep channel recesses can be obtained without a need for critical precise recess-etching processes and without degrading gate length resolution and gate quality. Also, due to the reversed process, full wafer processes for gate deposition and cleaning is possible.

The use of insulating sidewalls on the edges of the refractory metal gate avoids potential problems with gate-source or gate-drain shorts that may occur due to imperfect removal of the poly-crystalline n+ GaAs above the gate "mask". This leads to further improved reliability of the process and thus to higher yield.

The MESFET structure obtained by the described fabrication process has the advantage of having a very low source resistance because the source/drain contact plane can be raised considerably over the n-channel plane resulting in good current spreading and also in low substrate current injection. The low series resistance makes the device particularly suitable for high speed logic applications.

What is claimed is:

1. A method of fabricating a self-aligned metal-semiconductor field effect transistor, the transistor being formed on a semi-insulating semiconductor substrate and comprising a current channel and associated source, gate and drain electrodes, characterized in that it comprises the following steps:

forming an active channel layer at the surface of said semiconductor substrate, depositing a refractory metal gate layer over said substrate surface, selectively etching said gate layer to form said gate electrode, depositing a thin dielectric layer over said gate electrode and over said substrate surface, etching said dielectric layer so as to form an insulating sidewall layer on the vertical ediges of said gate electrode, forming a highly doped continuous semiconductor contact layer over said substrate surface, over said gate electrode and over said insulating sidewall layer, said contact layer being mono-crystalline material over said substrate surface and poly-crystalline material over said gate electrode and over said insulating sidewall layer, removing said poly-crystalline material, and depositing and selectively etching a metal layer over said mono-crystalline material to form said source and said drain electrodes.

2. A method as set forth in claim 1 wherein said dielectric etching is performed by an anisotropic etching process.

3. A method as set forth in claim 1 wherein said semi-insulating substrate includes gallium arsenide.

4. A method as set forth in claim 3 wherein said highly doped continuous contact layer includes GaALAs.

5. A method of fabricating a transistor which includes the steps of:

forming an n conductivity type channel at the surface of a semi-insulating semiconductor substrate, depositing a refractory metal layer over said channel, etching said metal layer to form a gate electrode, depositing a layer of dielectric material over said gate electrode and over said substrate surface, etching said layer of dielectric material so as to form an insulating sidewall layer on the vertical edges of said gate electrode, forming a highly n+ doped continuous semiconductor layer over said channel, over said gate electrode and over said insulating sidewall layer, etching portions of said semiconductor layer disposed over said gate electrode and over said insulating sidewall layer, and forming a metallic contact to the remaining portion of said semiconductor layer.

6. A method as set forth in claim 5 wherein said etching includes anisotropically etching said layer of dielectric material to form spacers on the vertical edges of said gate electrode.

7. A method as set forth in claim 5 wherein said semiconductor substrate is gallium arsenide.

8. A method as set forth in claim 5 wherein said refractory metal layer is tungsten silicide.

9. A method as set forth in claim 5 wherein said semiconductor layer is gallium arsenide.

10. A method as set forth in claim 5 wherein said semiconductor layer is gallium aluminum arsenide.

* * * * *